United States Patent [19]

Nakajima et al.

[11] Patent Number: 5,069,979

[45] Date of Patent: Dec. 3, 1991

[54] PLATED COPPER ALLOY MATERIAL

[75] Inventors: Takashi Nakajima; Akira Yugi; Shinichi Iwase, all of Sagamihara, Japan

[73] Assignee: Mitsubishi Denki Kabushiki Kaisha, Tokyo, Japan

[21] Appl. No.: 663,303

[22] Filed: Mar. 1, 1991

[30] Foreign Application Priority Data

Mar. 19, 1990 [JP] Japan .................................. 2-69411
Mar. 19, 1990 [JP] Japan .................................. 2-69412

[51] Int. Cl.$^5$ .............................................. B32B 15/20
[52] U.S. Cl. .................................... 428/644; 428/647; 428/675; 439/886
[58] Field of Search ............... 428/644, 645, 647, 675, 428/929; 439/886, 887

[56] References Cited

U.S. PATENT DOCUMENTS

| | | | |
|---|---|---|---|
| 3,585,010 | 6/1971 | Luce et al. .......................... | 428/647 |
| 4,049,481 | 9/1977 | Morisaki ............................. | 428/647 |
| 4,441,118 | 4/1984 | Fisher et al. ........................ | 428/675 |
| 4,824,737 | 4/1989 | Hiesbock et al. ................... | 428/675 |

FOREIGN PATENT DOCUMENTS

| | | | |
|---|---|---|---|
| 1105185 | 4/1961 | Fed. Rep. of Germany ...... | 428/675 |
| 2348606 | 6/1974 | Fed. Rep. of Germany ...... | 439/887 |
| 57-57422 | 4/1982 | Japan .................................. | 428/675 |
| 184482 | 10/1984 | Japan . | |

OTHER PUBLICATIONS

Mitsubishi Denki Alloy Product Catalogue, Plated Alloy, p. 57.

*Primary Examiner*—John J. Zimmerman
*Attorney, Agent, or Firm*—Oblon, Spivak, McClelland, Maier & Neustadt

[57] ABSTRACT

Plated copper alloy material with an undercoat plating and an overcoat plating on the copper alloy, wherein the undercoat plating consists essentially of 0.03% to 5% by weight of zinc (Zn) and the remainder of copper (Cu) in the substantial part thereof, the total quantity of Zn and Cu being 98% or above and the total quantity of other elements being 2% or below.

4 Claims, No Drawings

PLATED COPPER ALLOY MATERIAL

BACKGROUND OF THE INVENTION

1. Field of the Invention

This invention relates to a plated copper alloy material to be used as a copper alloy wire, plate, etc. for electronic apparatuses and appliances, such as terminals, connectors and so forth.

2. Discussion of Background

As the plated copper alloy wire, plate, etc. for electronic apparatuses and appliances, for instance, there has so far been in much use of brass type or phosphor bronze type copper alloys, in the main, as the matrix, on which a plating is applied.

With regard to such plated copper alloy materials, there are various modes in their undercoat plating; that is, no undercoat plating is applied, copper plating is applied, or nickel plating is applied. In case the undercoat plating is applied, it is done under various conditions such that its thickness is varied, or others. With such background in mind, plated phosphor bronze type copper alloy forms the main current in the field of use where a relatively high reliability is demanded on the products, hence, depending on the level of demand on the adhesive reliability of plating, there have been used those undercoat plating formed under various conditions.

In recent years, with the electronic apparatuses and appliances tending to be miniaturized and to have high output capability, the circumstances, under which these electronic apparatuses and appliances are used, are becoming more and more stringent. For instance, with regard to connectors or the like, there is a problem of temperature rise due to their heat generation, etc. When the connectors, etc. are used in such circumstances of use, adhesion between the plating and the matrix becomes lowered, which may lead to exfoliation of the plating. As such, in recent years, much higher operating reliability is required of those parts for the electronic apparatuses and appliances of high output capacity.

As a method for manufacturing the plated contact element made of phosphor bronze and having high operating reliability, there has been proposed one, in which an undercoat plating of copper is thinly applied onto the matrix of phosphor bronze with use of a cyanide bath having a monovalent copper ion concentration of 10 to 60 g/l and an isolated cyanogen concentration of 10 to 20 g/l; thereafter tin or solder, as an overcoat plating, is electrically plated on this undercoat; and subsequently the entire combination of the matrix, the undercoat plating, and the over coat plating is subjected to heat-melting, or such tin or solder as the overcoat plating is melt-plated onto the matrix (vide: Japanese Unexamined Patent Publication No. 184482/1984).

With regard to the adhesive property of the copper alloy plating, it has been known that a fragile dispersion layer of Cu and Sn is formed in the neighborhood of the interface between the copper alloy and the plating, and Kirkendall voids are generated, due to mutual dispersion between copper in the copper alloy and tin in the plating, on account of which the adhesive property of the plating becomes lowered.

As for the influence of the undercoat plating on the heat-resistant adhesive property of the overcoat plating, the current situation is such that the nickel undercoat plating possesses the highest reliability, and that in case of the copper undercoat plating or in case where the undercoat plating is not provided, the heat-resistant adhesive property over a long period of time is relatively poor in its reliability. The nickel plating, however, has its characteristic of being relatively hard, while the matrix with the nickel undercoat plating having been applied onto it has a considerable disadvantage of tending to bring about cracks on the surface layer thereof during its shaping work by press, etc., hence it has a problem of being difficult to be utilized industrially.

SUMMARY OF THE INVENTION

It is therefore an object of the present invention to provide a plated copper alloy material having the overcoat plating of remarkably excellent heat-resistant adhesive property, thereby improving the points of problem inherent in the conventional plated copper alloy material.

The plated copper alloy material, according to the present invention, with an undercoat plating and an overcoat plating being applied onto the copper alloy is so constructed that the undercoat plating consists essentially of 0.03% to 5% by weight of zinc (Zn) and the remainder of copper (Cu) in the substantial part thereof, the total quantity of Zn and Cu being 98% or above and the total quantity of other elements being 2% or below.

DETAILED DESCRIPTION OF PREFERRED EMBODIMENTS

With the plated copper alloy material of the present invention, occurrence of the Kirkendall voids is suppressed by the movement of zinc in the undercoat plating, in the course of a series of dispersion phenomenon of copper at the interface between the copper alloy and the plating and tin in the plating, with the consequent improvement in the heat-resistant adhesive property of the plating.

The effect of the undercoat plating comes out with the zinc content of 0.03%. The improvement becomes conspicuous as the zinc content increases. However, when the zinc content exceeds 5%, there emerges decrease in its solder-wetting property after the plating.

The undercoat plating, which contains therein zinc and remainder of copper in its major part, aims at improvement in the adhesive property of the plating with the matrix or the overcoat plating as well as suppression of progress in the dispersion phenomenon between the matrix and the overcoat plating, thickness of the plating being in such a range that is capable of obtaining the industrially usable effect.

A typical example of a copper alloy used in the present invention includes phosphor bronze (Sn: 1–10%, P: max 0.35%, Cu: balance).

A typical solder plating used as an overcoat plating in the present invention consists essentially of from 50 to 70% by weight of Sn and from 30 to 50% by weight of Pb.

With a view to enabling those persons skilled in the art to put the present invention into practice, the following preferred examples are provided. It should, however, be understood that these examples are illustrative only and not so restrictive, and that any changes and modifications may be made in the ingredients used and the plating conditions within the ambit of the present invention as recited in the appended claims.

EXAMPLES 1 to 10 and COMPARATIVE EXAMPLES 1 to 8

As the matrix, use was made of a web of copper alloy, Japanese Industrial Standard JIS-C5111 (Cu-4%Sn-0.1%P) or C5210 (Cu-8%Sn-0.1%P) having a plate thickness of 0.25 mm. Under various conditions as shown in Table 1 below, the undercoat plating of a thickness of 0.5 μm was applied onto this copper alloy material by means of an electric plating device in an industrial scale, followed by plating of tin to a thickness of 2.5 μm, thereby producing tin-plated copper alloy web.

For testing the adhesive property of the plating, use was made of an oblong test specimen having 20 mm in width and 80 mm in length. The test specimen was subjected to an accelerating test by heat in a constant temperature vessel kept at a temperature of 150° C, and the adhesive property of the plating was evaluated in terms of its decrease with lapse of time. As to presence or absence of the deterioration in the adhesive property of the plating, the test specimen which had completed its heating for a predetermined time was subjected to contact bending test, followed by bending it to its initial state, and then the bent portion of the test specimen was observed through a stereo-microscope (20 magnification) to determine its state by the presence or absence of any exfoliation of the tin-plating.

Also, the solder-wetting property and the shaping property of each specimen immediately, after its plating, was evaluated, in comparison.

Table 1 below indicates the comparisons of various characteristics in each of the Examples and each of the Comparative Examples.

TABLE 1

|  | Matrix | Undercoat plating | Time until plating peels off by heat of 150° C., after tin-plating (hrs.) | Solder-wetting time immediately after tin-plating (sec.)*1 | Shaping property immediately after tin-plating (radius of 0.2 mm)*2 |
| --- | --- | --- | --- | --- | --- |
| Comparative Example 1 | JIS C5111 | Nil | 810 | 2.2 | Good |
| Comparative Example 2 |  | Cu | 740 | 2.1 | Good |
| Comparative Example 3 |  | Ni | 1000 or longer | 1.9 | Fine cracks on the surface |
| Example 1 |  | 0.03% Zn—Cu | 920 | 2.0 | Good |
| Example 2 |  | 0.11% Zn—Cu | 1000 or longer | 2.1 | Good |
| Example 3 |  | 0.53% Zn—Cu | 1000 or longer | 2.3 | Good |
| Example 4 |  | 2.48% Zn—Cu | 1000 or longer | 2.3 | Good |
| Example 5 |  | 4.54% Zn—Cu | 1000 or longer | 2.6 | Good |
| Comparative Example 4 |  | 5.52% Zn—Cu | 1000 or longer | 4.4 | Good |
| Comparative Example 5 | JIS C5210 | Nil | 730 | 1.9 | Good |
| Comparative Example 6 |  | Cu | 710 | 2.2 | Good |
| Comparative Example 7 |  | Ni | 1000 or longer | 1.9 | Fine cracks on the surface |
| Example 6 |  | 0.03% Zn—Cu | 880 | 2.1 | Good |
| Example 7 |  | 0.11% Zn—Cu | 1000 or longer | 2.0 | Good |
| Example 8 |  | 0.53% Zn—Cu | 1000 or longer | 2.2 | Good |
| Example 9 |  | 2.48% Zn—Cu | 1000 or longer | 2.3 | Good |
| Example 10 |  | 4.54% Zn—Cu | 1000 or longer | 2.5 | Good |
| Comparative Example 8 |  | 5.52% Zn—Cu | 1000 or longer | 4.7 | Good |

Note:
*1 Solder wetting time was determined by immersing the test specimen into molten solder (60% Sn/40% Pb), and then finding out time until buoyancy and tension caused by the surface tension to occur at such immersion took balance.
*2 Bending test is in accordance with CES.B type W-bending test

EXAMPLES 11 to 20 and COMPARATIVE EXAMPLES 9 to 16

The same operations as in the preceding Examples and Comparative Examples were repeated with the exception that a solder plating composed of 60%Sn and 40%Pb was applied onto the copper alloy material, as the overcoat plating, instead of the tin-plating.

The results are shown in Table 2 below.

TABLE 2

|  | Matrix | Undercoat plating | Time until plating peels off by heat of 150° C., after tin-plating (hrs.) | Solder-wetting time immediately after tin-plating (sec.)*1 | Shaping property immediately after tin-plating (radius of 0.2 mm)*2 |
| --- | --- | --- | --- | --- | --- |
| Comparative Example 9 | JIS C5111 | Nil | 210 | 1.2 | Good |
| Comparative Example 10 |  | Cu | 240 | 1.1 | Good |
| Comparative Example 11 |  | Ni | 860 or longer | 1.1 | Fine cracks on the surface |
| Example 11 |  | 0.03% Zn—Cu | 820 | 1.0 | Good |
| Example 12 |  | 0.11% Zn—Cu | 960 or longer | 1.1 | Good |
| Example 13 |  | 0.53% Zn—Cu | 1000 or longer | 1.3 | Good |
| Example 14 |  | 2.48% Zn—Cu | 1000 or longer | 1.3 | Good |
| Example 15 |  | 4.54% Zn—Cu | 1000 or longer | 1.6 | Good |
| Comparative Example 12 |  | 5.52% Zn—Cu | 1000 or longer | 3.4 | Good |

TABLE 2-continued

|  | Matrix | Undercoat plating | Time until plating peels off by heat of 150° C., after tin-plating (hrs.) | Solder-wetting time immediately after tin-plating (sec.)*1 | Shaping property immediately after tin-plating (radius of 0.2 mm)*2 |
| --- | --- | --- | --- | --- | --- |
| Comparative Example 13 | JIS C5210 | Nil | 230 | 1.1 | Good |
| Comparative Example 14 |  | Cu | 210 | 1.2 | Good |
| Comparative Example 15 |  | Ni | 880 or longer | 1.1 | Fine cracks on the surface |
| Example 16 |  | 0.03% Zn—Cu | 840 | 1.1 | Good |
| Example 17 |  | 0.11% Zn—Cu | 900 or longer | 1.0 | Good |
| Example 18 |  | 0.53% Zn—Cu | 1000 or longer | 1.2 | Good |
| Example 19 |  | 2.48% Zn—Cu | 1000 or longer | 1.3 | Good |
| Example 20 |  | 4.54% Zn—Cu | 1000 or longer | 1.5 | Good |
| Comparative Example 16 |  | 5.52% Zn—Cu | 1000 or longer | 3.7 | Good |

Note:
*1Solder wetting time was determined by immersing the test specimen into molten solder (60% Sn/40% Pb), and then finding out time until buoyancy and tension caused by the surface tension to occur at such immersion took balance.
*2Bending test is in accordance with CES.B type W-bending test From the results shown in Tables 1 and 2 above, it is recognized that Examples 1 to 10 and 11 to 20 as well as Comparative Examples 4, 8, 12 and 16, with the undercoat plating containing therein zinc being applied thereonto, exhibited remarkable improvements on heat-resistant adhesive properties in comparison with Comparative Examples 1, 2, 5, 6, 9, 10, 13 and 14. Of these, Examples 1 to 10 and 11 to 20 are also excellent in their solder-wetting properties and the shaping properties.

On the contrary, the Comparative Examples 4, 8, 12 and 16 are as excellent as the Examples of the present invention in respect of their heat-resistant adhesive properties, but these Comparative Examples are recognized to be inferior in their solder-wetting properties immediately after the overcoat plating, hence they cannot be said to be perfect in respect of the industrial utility.

Further, the Comparative Examples 3, 7, 11 and 15 are as excellent as the Examples of the present invention in respect of the heat-resistant adhesive properties of the plating and the solder-wetting properties of the plating, but these Comparative Examples are inferior in their shaping properties, hence they are not suitable for industrial use.

Incidentally, in the above-described Examples of the present invention, the overcoat plated article of phosphor bronze type alloy in the stage of its crude plate was considered as an object. However, similar effect to the present invention can also be expected with respect to the overcoat plated article of other copper alloy type, by the application of the undercoat plating according to the present invention, even in the case of phosphor bronze, not subjected to the overcoat plating, being pressed or etched to be shaped into various parts for the electronic apparatuses and appliances, followed by applying the overcoat plating onto these parts to be practically used. Further, in an attempt to obtain uniformity in thickness of the plating, and to improve the wetting property of the plating, the adhesive property of the plating, and so forth, it is naturally possible to use the copper alloy material by re-heating and re-flow treatment after the overcoat plating.

As stated in the foregoing, since the present invention is so constructed that the undercoat plating consisting essentially of 0.03% to 5% by weight of zinc (Zn) and the remainder of copper (Cu) in the substantial part thereof (the total quantity of Zn and Cu being 98% or above, and the total quantity of other elements being 2% or below) is applied onto the copper alloy material, there can be obtained the copper alloy material having thereon the overcoat plating with remarkably excellent heat-resistant adhesive property.

What is claimed is:

1. Plated copper alloy material with an undercoat plating and an overcoat plating on the copper alloy, wherein said undercoat plating consists essentially of 0.03% to 5% by weight of zinc (Zn) and the remainder of copper (Cu) in the substantial part thereof, the total quantity of Zn and Cu being 98% or above and the total quantity of other elements being 2% or below.

2. The plated copper alloy material according to claim 1, wherein said overcoat plating is tin plating.

3. The plated copper alloy material according to claim 1, wherein said overcoat plating is solder plating.

4. The plated copper alloy material according to claim 3, wherein said solder plating consists essentially of from 50 to 70% by weight of Sn and from 30 to 50% by weight of Pb.

* * * * *